(12) United States Patent
Shirao

(10) Patent No.: US 10,256,810 B2
(45) Date of Patent: Apr. 9, 2019

(54) ELECTRONIC CIRCUIT AND ELECTRONIC TIMEPIECE

(71) Applicant: Seiko Epson Corporation, Tokyo (JP)

(72) Inventor: Akira Shirao, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/926,158

(22) Filed: Mar. 20, 2018

(65) Prior Publication Data

US 2018/0278247 A1    Sep. 27, 2018

(30) Foreign Application Priority Data

Mar. 23, 2017  (JP) .................. 2017-058223

(51) Int. Cl.
| | | |
|---|---|---|
| *H03K 17/22* | (2006.01) | |
| *G06F 1/26* | (2006.01) | |
| *G04G 19/06* | (2006.01) | |
| *G04G 99/00* | (2010.01) | |
| *H03K 17/00* | (2006.01) | |
| *H03K 21/02* | (2006.01) | |
| *H03K 17/284* | (2006.01) | |

(52) U.S. Cl.
CPC .......... *H03K 17/223* (2013.01); *G04G 19/06* (2013.01); *G04G 99/003* (2013.01); *G06F 1/26* (2013.01); *H03K 17/002* (2013.01); *H03K 17/22* (2013.01); *H03K 17/284* (2013.01); *H03K 21/02* (2013.01)

(58) Field of Classification Search
CPC ...... H03K 19/177; H03K 19/20; H03K 17/22; H03K 3/012; H03K 3/014; H03K 3/66; H03K 17/002; H03K 17/223; H03K 21/02

USPC ........................................ 327/142, 143, 198
See application file for complete search history.

(56) References Cited

U.S. PATENT DOCUMENTS

| | | | |
|---|---|---|---|
| 5,933,036 A | 8/1999 | Kim | |
| 6,011,447 A * | 1/2000 | Iwasaki | H03K 17/223 327/143 |
| 7,116,603 B2* | 10/2006 | Kanda | G11C 16/20 365/225.7 |
| 2001/0048328 A1 | 12/2001 | Sato | |
| 2003/0020513 A1 | 1/2003 | Watanabe | |
| 2005/0141576 A1* | 6/2005 | Ikeda | H01S 5/06835 372/38.02 |
| 2005/0195044 A1 | 9/2005 | Hitomi et al. | |
| 2006/0012409 A1* | 1/2006 | Wadhwa | H03K 17/223 327/143 |

(Continued)

FOREIGN PATENT DOCUMENTS

| | | | |
|---|---|---|---|
| JP | 04-315988 A | 11/1992 | |
| JP | 10-098365 A | 4/1998 | |

(Continued)

*Primary Examiner* — John W Poos
(74) *Attorney, Agent, or Firm* — Harness, Dickey & Pierce, P.L.C.

(57) ABSTRACT

Provided are an electronic circuit and electronic timepiece that can initialize internal circuits even if chattering occurs when a battery is installed. In the electronic circuit, when the initialization state hold signal is input, the initialization control circuit continues outputting the initialization control signal at the first level until the clock signal is output; and when the initialization state hold signal is input and the clock signal is output, outputs the initialization control signal at the second level cancelling the initialization process to the initialization circuit.

8 Claims, 13 Drawing Sheets

(56) References Cited

U.S. PATENT DOCUMENTS

2015/0026502 A1    1/2015   Itou

FOREIGN PATENT DOCUMENTS

| JP | 11-274856 A | 10/1999 |
| JP | 2001-344974 A | 12/2001 |
| JP | 2003-008426 A | 1/2003 |
| JP | 2005-252873 A | 9/2005 |
| JP | 2011-151723 A | 8/2011 |
| JP | 2015-022434 A | 2/2015 |

* cited by examiner

US 10,256,810 B2

ELECTRONIC CIRCUIT AND ELECTRONIC TIMEPIECE

BACKGROUND

1. Technical Field

The present invention relates to an electronic circuit and to an electronic timepiece having an initialization circuit for initializing internal circuits when a battery is installed.

2. Related Art

Integrated circuit devices having an initialization means that sets integrated circuits in an electronic timepiece to an initialized state in response to an external input, which is effected by operation of a timepiece function operating switch, for example, are known from the literature. See, for example, JP-A-H4-315988. Many modern electronic timepieces are multifunction timepieces having multiple operating modes such as a time display mode, stopwatch mode, and alarm mode. In addition to an initialization circuit, integrated circuits in such timepieces therefore commonly include a test control circuit for testing these multiple operating modes.

So that the internal circuits are not initialized when in the test mode, IC devices that have a test control circuit and an initialization means for initializing internal circuits of the IC devices, and have an initialization control circuit that uses a test control signal output from the test control circuit and a clock signal to control the initialization circuit, have also been developed.

An IC device 10 having such an initialization circuit and test control circuit according to the related art is described below with reference to the figures.

As shown in FIG. 10, the IC device 10 has an oscillator circuit 11, frequency divider 12, pulse shaping filter 13, driver 14, test control circuit 15, initialization control circuit 20, and initialization circuit 30. The IC device 10 also has power supply terminals VDD, VSS; connection terminals GATE, DRAIN, O1, O2; operation input terminal P1; and test terminal TEST.

In this configuration, the battery of the electronic timepiece is connected to power supply terminals VDD, VSS.

The crystal oscillator of the electronic timepiece is connected to connection terminals GATE, DRAIN. The crystal oscillator outputs a clock signal at a specific frequency (32768 Hz) as controlled by the oscillator circuit 11.

The coil of a motor of the electronic timepiece is connected to connection terminals O1, O2.

The motor is a bipolar stepper motor, and is driven by the motor drive pulse output from the IC device 10.

An operating signal corresponding to operation of the crown of the electronic timepiece is input to the operation input terminal P1.

A test signal is input to the test terminal TEST by contact with the probe of a circuit tester, for example.

The oscillator circuit 11 causes the crystal oscillator, which is the reference signal source, to oscillate at high frequency, and outputs a 32768-Hz clock signal produced by the high frequency oscillation to the frequency divider 12 and initialization control circuit 20.

The frequency divider 12 frequency divides the output of the oscillator circuit 11, and outputs to the pulse shaping filter 13.

The pulse shaping filter 13, based on the clock signal output from the frequency divider 12, generates a pulse of a specific waveform that controls driving the motor, and outputs to the driver 14.

The driver 14 supplies current to the motor coil according to the pulses output from the pulse shaping filter 13, and drives the motor.

The test control circuit 15 is connected to the operation input terminal P1 and test terminal TEST, generates a test control signal according to the operating signal and test signal, and outputs to the frequency divider 12, pulse shaping filter 13, and initialization control circuit 20. The test control circuit 15 outputs the test control signal by outputting a High level or Low level signal. More specifically, the test control circuit 15 outputs a test control signal setting a non-test mode (normal mode) by outputting a High level signal, and outputs a test control signal setting a test mode by outputting a Low level signal.

When a battery is installed by setting the battery in the electronic timepiece, the initialization circuit 30 outputs a Low level (first level) initialization control signal to the frequency divider 12, pulse shaping filter 13 and driver 14 to initialize the circuits 12 to 14. A specific operating mode is set by these circuits 12 to 14 executing the initialization process. In this example, the specific operating mode is the time display mode. The initialization circuit 30, as controlled by the initialization control circuit 20, then changes the initialization control signal from the Low level to the High level (second level) to cancel the initialization process, and outputs to the circuits 12 to 14.

The initialization control circuit 20 controls the initialization circuit 30 based on the test control signal and clock signal to output a Low level or High level initialization control signal.

Configuration of the Initialization Control Circuit

As shown in FIG. 11, the initialization control circuit 20 has logic circuits 21, 22. Each of the logic circuits 21, 22 has two inputs and one output.

The test control signal is input to one input node of logic circuit 21, and the clock signal is input to the other input node. The output of logic circuit 21 is connected to the gate node of a field effect transistor N2 described below of the initialization circuit 30, and the input node of logic circuit 22.

The test control signal is also input to one input node of logic circuit 22, and output node of the other logic circuit 21 is input to the other input node of the 22. The output of logic circuit 22 is connected to the gate of a field effect transistor N1 described below of the initialization circuit 30.

When a High test control signal setting the non-test mode is input, and the clock signal is not input, to the initialization control circuit 20, logic circuit 21 outputs a High level signal and turns field effect transistor N2 on, and the logic circuit 22 outputs a Low level signal and turns field effect transistor N1 off. When a High test control signal setting the non-test mode is input, and the clock signal is input, logic circuit 21 outputs a Low level signal every time the clock signal changes from Low to High, and outputs a High level signal every time the clock signal changes from High to Low. The logic circuit 22 outputs a signal that inverts the level of the output level of the logic circuit 21. As a result, a state in which field effect transistor N1 is on and field effect transistor N2 is off, and a state in which field effect transistor N1 is off and field effect transistor N2 is on, are alternately set.

When a Low level test control signal setting the test mode is input, logic circuits 21, 22 output a High level signal regardless of the state of the clock signal. As a result, field effect transistors N1 and N2 are on.

Configuration of the Initialization Circuit

As shown in FIG. 11, the initialization circuit 30 includes n-channel field effect transistors N1 and N2, capacitors C1 and C2, resistance R1, and a NOT gate 31.

The field effect transistors N1 and N2 are connected in series between power supply terminal VSS and the input of NOT gate 31. The gate electrode of the field effect transistor N1 is connected to the output node of logic circuit 22. The gate electrode of field effect transistor N2 is connected to the output node of logic circuit 21.

Capacitor C1 is connected between power supply terminal VDD and a node between field effect transistor N1 and field effect transistor N2. Capacitor C2 is connected between power supply terminal VDD and a node A1 between field effect transistor N2 and NOT gate 31. Resistance R1 is connected between power supply terminal VDD and node A1.

When the initialization circuit 30 turns field effect transistor N1 off, capacitor C1 is not charged. When a charge is not stored in capacitors C1 and C2, the potential of node A1 goes to the potential (VDD potential) of power supply terminal VDD, and NOT gate 31 outputs a Low level initialization control signal.

When field effect transistor N1 is on and field effect transistor N2 is off, capacitor C1 is charged. When field effect transistor N1 is off and field effect transistor N2 is on, the charge stored in capacitor C1 is charged to capacitor C2. By alternating charging capacitor C1 and charging capacitor C2, the potential of node A1 drops to the potential of power supply terminal VSS (potential VSS). When the potential of node A1 goes to or below the threshold of NOT gate 31, NOT gate 31 outputs a High level initialization control signal. In other words, the initialization circuit 30 outputs a Low level initialization control signal when the charge voltage of the capacitor C2 is less than a previously set threshold, and outputs a High level initialization control signal when the charge voltage is greater than or equal to the threshold.

When field effect transistors N1 and N2 are on, capacitors C1 and C2 are charged, the potential of node A1 goes to potential VSS, and the NOT gate 31 outputs a High level initialization control signal.

IC Device Operation

Operation of the IC device 10 is described next with reference to the timing chart in FIG. 12.

As shown in FIG. 12, when a battery is installed in the electronic timepiece at time T1, a charge is not stored in the capacitors C1 and C2 of the initialization circuit 30, the potential of node A1 is VDD, and a Low level initialization control signal is output from the NOT gate 31.

Immediately after time T1, the oscillator circuit 11 does not output the clock signal. In addition, the test control circuit 15 outputs a test control signal setting the non-test mode (normal mode) by outputting a High level signal.

As a result, capacitors C1 and C2 are not charged, and the potential of node A1 remains VDD. As a result, a Low level initialization control signal continues to be output from the NOT gate 31. The frequency divider 12, pulse shaping filter 13, and driver 14 therefore execute the initialization process, and circuits 12 to 14 are set to the time display mode.

When the oscillator circuit 11 starts operating and outputs the clock signal at time T2 while the test control circuit 15 continues outputting the test control signal (High level) setting the non-test mode, capacitors C1 and C2 are alternately charged, and the potential of node A1 starts dropping to VSS.

At time T3, the potential of node A1 drops to the threshold of the NOT gate 31, and an High level initialization control signal is output from the NOT gate 31. As a result, the initialization process of the frequency divider 12, pulse shaping filter 13, and driver 14 is cancelled. The circuits 12 to 14 remain in the time display mode.

If at time T4 the crown is pulled out to the first stop in the operation starting the test mode, and the test signal is input to the test terminal TEST, the test control circuit 15 outputs the test control signal setting the test mode by outputting a Low level signal. As a result, the frequency divider 12 and pulse shaping filter 13 are set to the test mode. In the test mode, the waveform of the motor drive pulse is tested, and the consumption current is tested.

The charge state of the capacitors C1 and C2 is also maintained, and the potential of node A1 is held at potential VSS. As a result, a High level initialization control signal continues to be output from the NOT gate 31. The initialization process is also not executed by the frequency divider 12, pulse shaping filter 13, and driver 14.

Next, because circuits 12 to 14 are tested at time T5, the clock signal output process of the oscillator circuit 11 is stopped by the test control circuit 15. Because the potential of node A1 remains potential VSS at this time, the NOT gate 31 continues outputting a High level initialization control signal.

However, the following problems remain with the IC device 10 described above.

Specifically, as shown in FIG. 13, when a battery is installed, chattering may occur at the power supply terminal VDD of the IC device 10 as indicated by waveform W1. When this happens, the signal level of the test control signal may repeatedly go between the High level and Low level. As a result, before the clock signal is output from the oscillator circuit 11, the capacitor C2 is charged, the potential of node A1 goes to VSS, and a High level initialization control signal may be output from the NOT gate 31. As a result, the frequency divider 12, pulse shaping filter 13, and driver 14 cannot initialize, the circuits 12 to 14 are unintentionally set to another operating mode instead of the time display mode, and the circuits 12 to 14 do not operate correctly. This problem may also occur in a configuration that controls the initialization circuit 30 using a clock signal and a function control signal that sets function modes and non-function modes other than a test mode.

SUMMARY

An objective of the invention is to provide an electronic circuit and electronic timepiece that can initialize internal circuits even when chattering occurs when a battery is installed.

An electronic circuit according to the invention has: an oscillator circuit configured to output a clock signal; a function control circuit configured to output a function control signal that sets a function mode and a non-function mode; an internal circuit; an initialization circuit configured to output an initialization control signal that changes between a first level for executing an internal circuit initialization process, and a second level cancelling the initialization process; an initialization control circuit configured to control the initialization circuit; an input control circuit configured to change input and non-input of the function control signal to the initialization control circuit; and an initialization state holding circuit. The initialization circuit outputs the initialization control signal at the first level when a battery is installed. The input control circuit does not input the function control signal to the initialization control circuit when the initialization control signal is output at the first level, and inputs the function control signal to the initialization control circuit when the initialization control signal is output at the second level. The initialization state holding circuit outputs an initialization state hold signal to the initialization control circuit when the function control signal is not input to the initialization control circuit. When the initialization state hold signal is input, the initialization control circuit continues outputting the initialization control signal at the first level to the initialization circuit until the clock signal is output; and when the initialization state hold signal was input and the clock signal then output, outputs the initialization control signal at the second level to the initialization circuit.

The initialization circuit of the invention is configured to output the initialization control signal at the first level executing the internal circuit initialization process when a battery is installed. As a result, when a battery is installed, the function control signal is not input by the input control circuit to the initialization control circuit, and an initialization state hold signal is input by the initialization state holding circuit to the initialization control circuit. The initialization control circuit continues outputting the initialization control signal at the first level to the initialization circuit until the oscillator circuit operates and the clock signal is output. For example, the initialization control circuit determines the clock signal was output if the output level of the oscillator circuit changes multiple times from the Low level to the High level. As a result, the internal circuits can be initialized and a specific operating mode can be set.

When the clock signal is output from the oscillator circuit, the initialization control circuit causes the initialization circuit to output the initialization control signal at the second level, which cancels the initialization process. As a result, a function control signal is input to the initialization control circuit by the input control circuit. The initialization control circuit also causes the initialization circuit to continue outputting the initialization control signal at the second level.

Because the initialization circuit outputs the initialization control signal at the first level from when a battery is installed until the oscillator circuit operates and the clock signal is output regardless of the signal level of the function control signal, the internal circuits can be reliably initialized and the internal circuits can be set to a specific operating mode even if chattering occurs when a battery is installed and the signal level of the function control signal changes repeatedly.

Preferably, in an electronic circuit according to another aspect of the invention, the initialization circuit has a capacitor, outputs the initialization control signal at the first level when the voltage charge of the capacitor is less than a previously set threshold, and outputs the initialization control signal at the second level when the voltage charge is greater than or equal to the threshold; and the initialization control circuit charges the capacitor according to the clock signal when the initialization state hold signal is input.

Thus comprised, because the capacitor is not charged before a battery is installed, the initialization control signal can be reliably output at the first level from the initialization circuit when a battery is installed.

In addition, by controlling charging the capacitor, the initialization control circuit causes the initialization circuit to continue outputting the initialization control signal at the first level until the oscillator circuit operates and the clock signal is output, and when the clock signal is output, causes the initialization circuit to output the initialization control signal at the second level.

This configuration also enables configuring the initialization circuit with a simple circuit using a capacitor.

Further preferably, an electronic circuit according to another aspect of the invention also has a delay circuit configured to delay the initialization control circuit output from the initialization circuit to the internal circuit.

By increasing the length of the initialization process, this configuration enables reliably initializing the internal circuits even if chattering occurs for a long time. Furthermore, because there is no need to change the configuration of the initialization circuit or initialization control circuit, the length of the initialization process can be increased by a small scale design change.

Further preferably, an electronic circuit according to another aspect of the invention also has an operation input terminal to which an operating signal corresponding to operation of an operating member is input; and an operation input control circuit configured to switch input and non-input of the operating signal to the function control circuit. The function control circuit outputs the function control signal that sets the function mode in response to the operating signal. The function control signal is input to the internal circuit; and the operation input control circuit does not input the operating signal to the function control circuit while the initialization control signal is output at the first level.

With this configuration, the operating signal is not input to the function control circuit when the function control signal is output at the first level from the initialization circuit and the internal circuits are being initialized. As a result, setting a function mode while the internal circuits execute the initialization process can be avoided even when the operating means is unintentionally operated to set a function mode. As a result, internal circuits can be reliably initialized.

Another aspect of the invention is an electronic timepiece having: the electronic circuit according to the invention; and a display device configured to display time as controlled by the internal circuit.

The electronic circuit described above can set the internal circuits to a specific operating mode when a battery is installed. As a result, the reliability of an electronic timepiece in which the displayed time is controlled by internal circuits can be improved.

Other objects and attainments together with a fuller understanding of the invention will become apparent and appreciated by referring to the following description and claims taken in conjunction with the accompanying drawings.

DESCRIPTION OF EMBODIMENTS

Embodiments

Figure 1:
FIG. 1 is a plan view of an electronic timepiece according to the invention.

Preferred embodiments of an electronic timepiece 1 according to the present invention are described below with reference to the accompanying figures. Note that like configurations in the following embodiments and the electronic timepiece according to the related art described above are identified by like reference numerals, and further description thereof is omitted.

As shown in FIG. 1, the electronic timepiece 1 in this embodiment of the invention is a wristwatch worn on the user's wrist, and has an outside case 2, round dial 3, a movement not shown, a second hand 5, minute hand 6, and hour hand 7 that are hands driven by a motor disposed to the movement, and a crown 8 and button 9 as operating members. The second hand 5, minute hand 6, and hour hand 7 are driven by a motor not shown, and indicate the second, minute, and hour by pointing to markers on the dial 3. The hands 5 to 7 and dial 3 thus embody a display unit for displaying the time.

Figure 2:
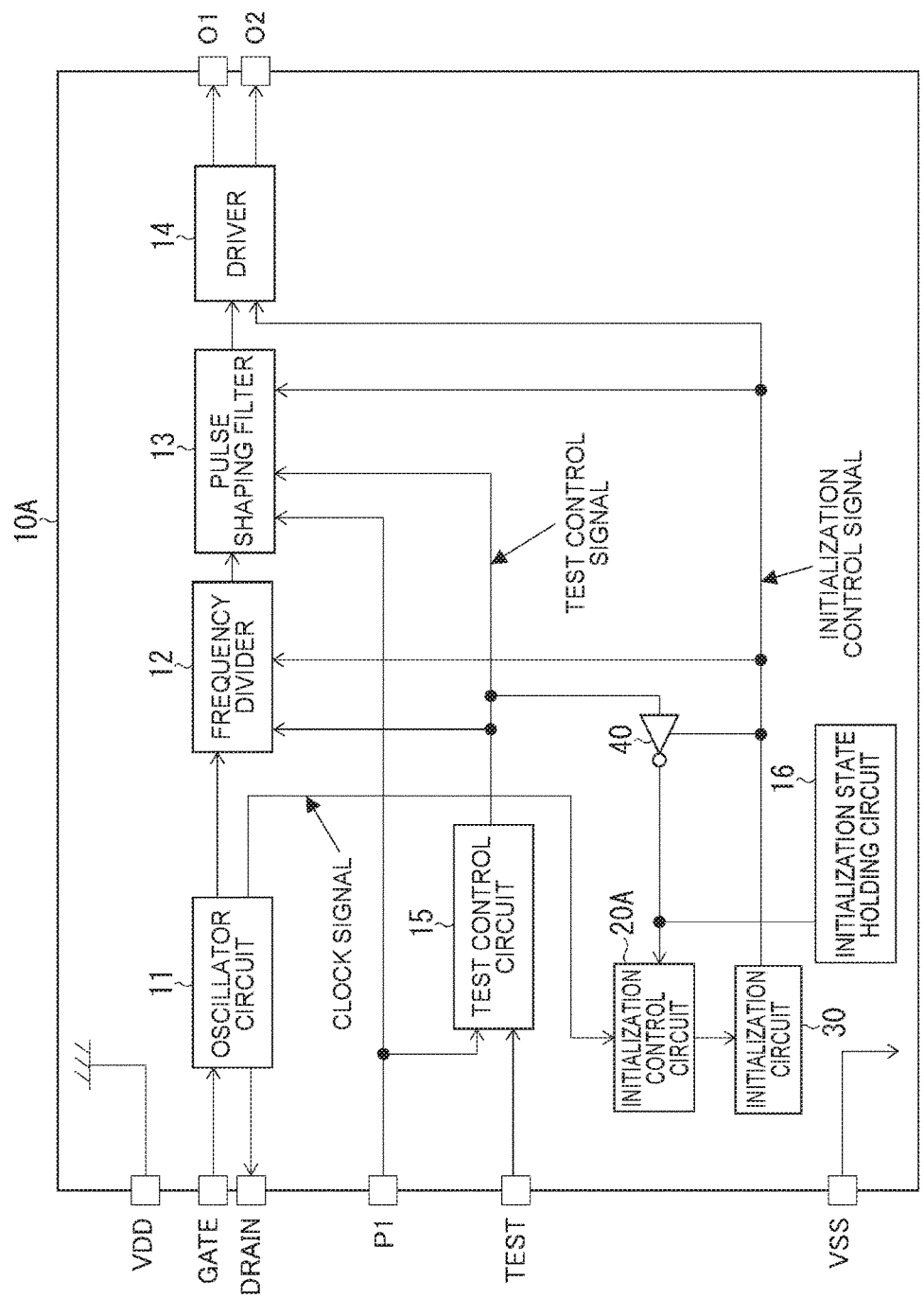
FIG. 2 is a circuit diagram of an IC device according to an embodiment of the invention.

As shown in FIG. 2, the IC device 10A, which is an electronic circuit of the electronic timepiece 1, includes an oscillator circuit 11, frequency divider 12, pulse shaping filter 13, driver 14, test control circuit 15 as a function control circuit, initialization control circuit 20A, initialization circuit 30, initialization state holding circuit 16, and input control circuit 40. The frequency divider 12, pulse shaping filter 13, and driver 14 are internal circuits. The IC device 10A includes power supply terminals VDD, VSS, connection terminals GATE, DRAIN, O1, O2, operation input terminal P1, and test terminal TEST.

An initialization control signal is input to the input control circuit 40. When a Low level initialization control signal is input, the test control signal (function control signal) is not input to the initialization control circuit 20A. When a High level initialization control signal is input, the test control signal is input to the initialization control circuit 20A. In this embodiment of the invention, the signal level of the test control signal is inverted when input to the initialization control circuit 20A.

When the test control signal is not input to the initialization control circuit 20A, the initialization state holding circuit 16 outputs a Low level initialization state hold signal to the initialization control circuit 20A. When the test control signal is input to the initialization control circuit 20A, the initialization state hold signal is not output to the initialization control circuit 20A. This embodiment uses a constant-current source as the initialization state holding circuit 16.

Configuration of the Initialization Control Circuit

Figure 3:
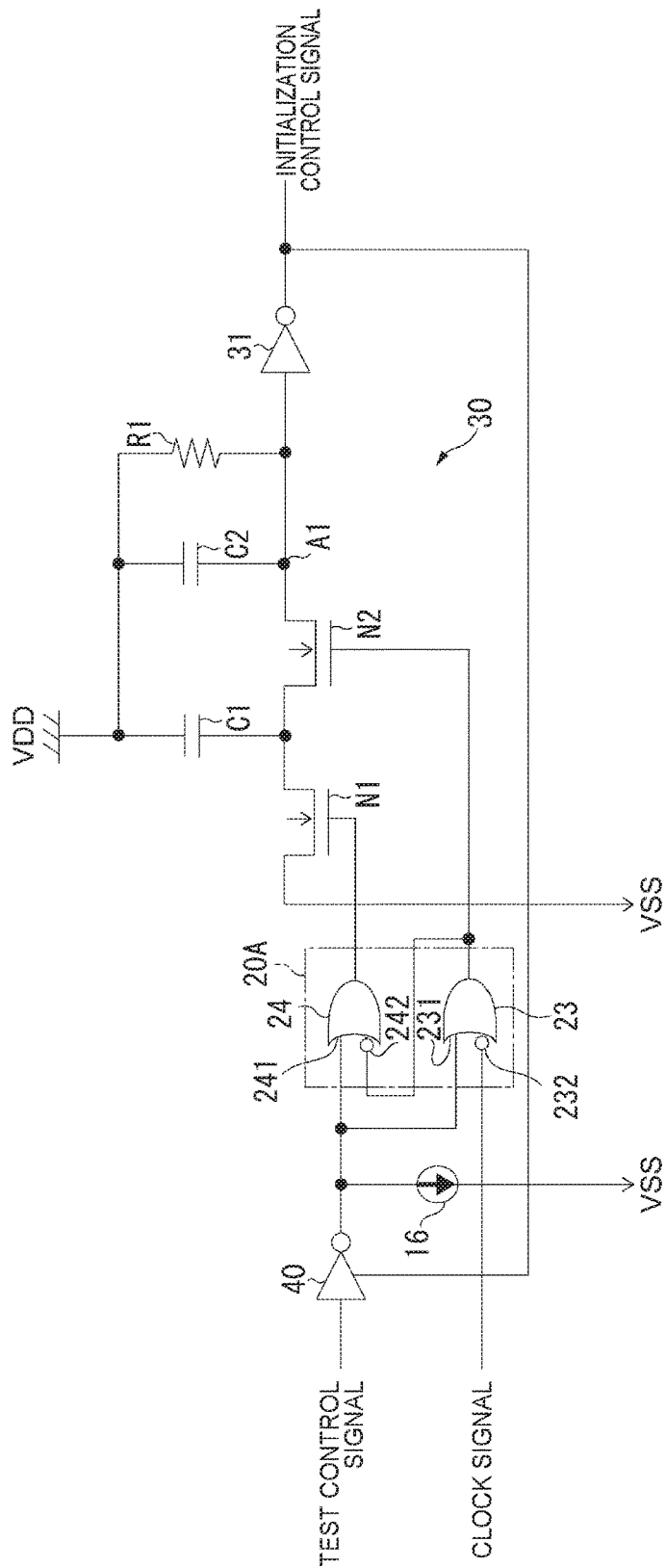
FIG. 3 is a circuit diagram of an initialization control circuit and initialization circuit according to an embodiment of the invention.

As shown in FIG. 3, the initialization control circuit 20A has logic circuits 23, 24. The logic circuits 23, 24 each have a first input terminal 231, 241 and second input terminal 232, 242, and one output terminal.

The output terminal 41 (see FIG. 4) of the input control circuit 40 and the initialization state holding circuit 16, which is a constant-current source, are connected to the first input terminal 231 of the logic circuit 23, and the clock signal is input to the second input terminal 232. The output terminal of the logic circuit 23 is connected to the gate electrode of the field effect transistor N2 of the initialization circuit 30, and the second input terminal 242 of logic circuit 24.

The output terminal 41 of the input control circuit 40, and the initialization state holding circuit 16, are connected to the first input terminal 241 of the logic circuit 24, and the output terminal of the logic circuit 23 is connected to second input terminal 242. The output terminal of the logic circuit 24 is connected to the gate electrode of the field effect transistor N1 of the initialization circuit 30.

When the test control signal is not input, an initialization state hold signal (Low level) is input, and the clock signal is not input to the initialization control circuit 20A, logic circuit 23 outputs a High level signal and field effect transistor N2 goes on, and logic circuit 24 outputs a Low level signal and field effect transistor N1 goes off.

When the test control signal is not input, the initialization state hold signal is input, and the clock signal is input, logic circuit 23 outputs a Low level signal each time the clock signal changes from the Low level to the High level, and outputs a High level signal each time the clock signal changes from the High level to the Low level. The logic circuit 24 outputs a signal at the inverted level of the output level of logic circuit 23. As a result, a state in which field effect transistor N1 is on and field effect transistor N2 is off, and a state in which field effect transistor N1 is off and field effect transistor N2 is on, are alternately set.

When the High level signal setting the non-test mode (non-function mode) is input inverted by the input control circuit 40, the initialization control circuit 20A operates in the same way as when the initialization state hold signal is input.

When the Low level signal setting the test mode (function mode) is input inverted by the input control circuit 40 to the initialization control circuit 20A, the logic circuits 23, 24 always output a High level signal regardless of the clock signal. As a result, field effect transistors N1 and N2 are on.

Configuration of the Input Control Circuit

Figure 4:
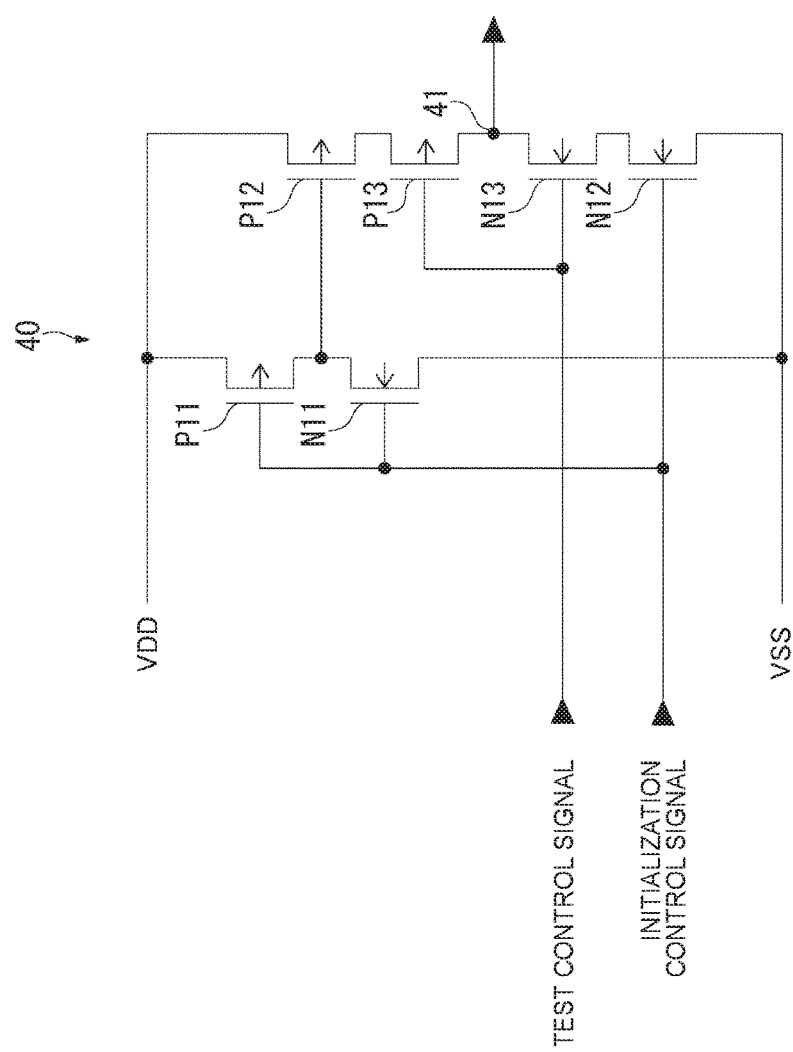
FIG. 4 is a circuit diagram of an input control circuit according to an embodiment of the invention.

The input control circuit 40 is embodied by a clocked inverter, and as shown in FIG. 4, has n-channel field effect transistors N11, N12, N13, and p-channel field effect transistors P11, P12, P13.

Field effect transistors P12, P13 are connected in series between the power supply terminal VDD and output terminal 41. Field effect transistors N12, N13 are connected in series between power supply terminal VSS and output terminal 41.

The test control signal is input to the gate electrodes of field effect transistors N13, P13. The initialization control signal is input to the gate electrode of field effect transistor N12.

Field effect transistors P11, N11 are connected in series between power supply terminal VDD and power supply terminal VSS. The connection node between field effect transistors P11, N11 is connected to the gate electrode of field effect transistor P12. The initialization control signal is input to the gate electrode of field effect transistors P11, N11.

When a Low level initialization control signal is input, the field effect transistors N1 and N2 of the input control circuit 40 turn off, field effect transistor P11 turns on, and field effect transistor N11 turns off. As a result, the potential of the gate electrode of field effect transistor P12 goes to VDD, and field effect transistor P12 turns off. As a result, the output terminal 41 is isolated form power supply terminals VDD, VSS, and goes to a high impedance state.

When a High level initialization control signal is input, the field effect transistors N1 and N2 of the input control circuit 40 go on, field effect transistor P11 turns off, and field effect transistor N11 turns on. As a result, the potential of the gate electrode of field effect transistor P12 goes to VSS, and field effect transistor P12 turns on. As a result, the output terminal 41 is connected to power supply terminals VDD, VSS, and a signal of the inverted phase of the test control signal is output from the output terminal 41. In other words, when a High level test control signal is input, a Low level signal is output from the output terminal 41. The input control circuit 40 is able to pass more current than the constant-current source. As a result, a High level signal is output from the output terminal 41 when the Low level test control signal is input.

IC Device Operation

Operation of the IC device 10A is described next with reference to the timing chart in FIG. 5.

Figure 5:
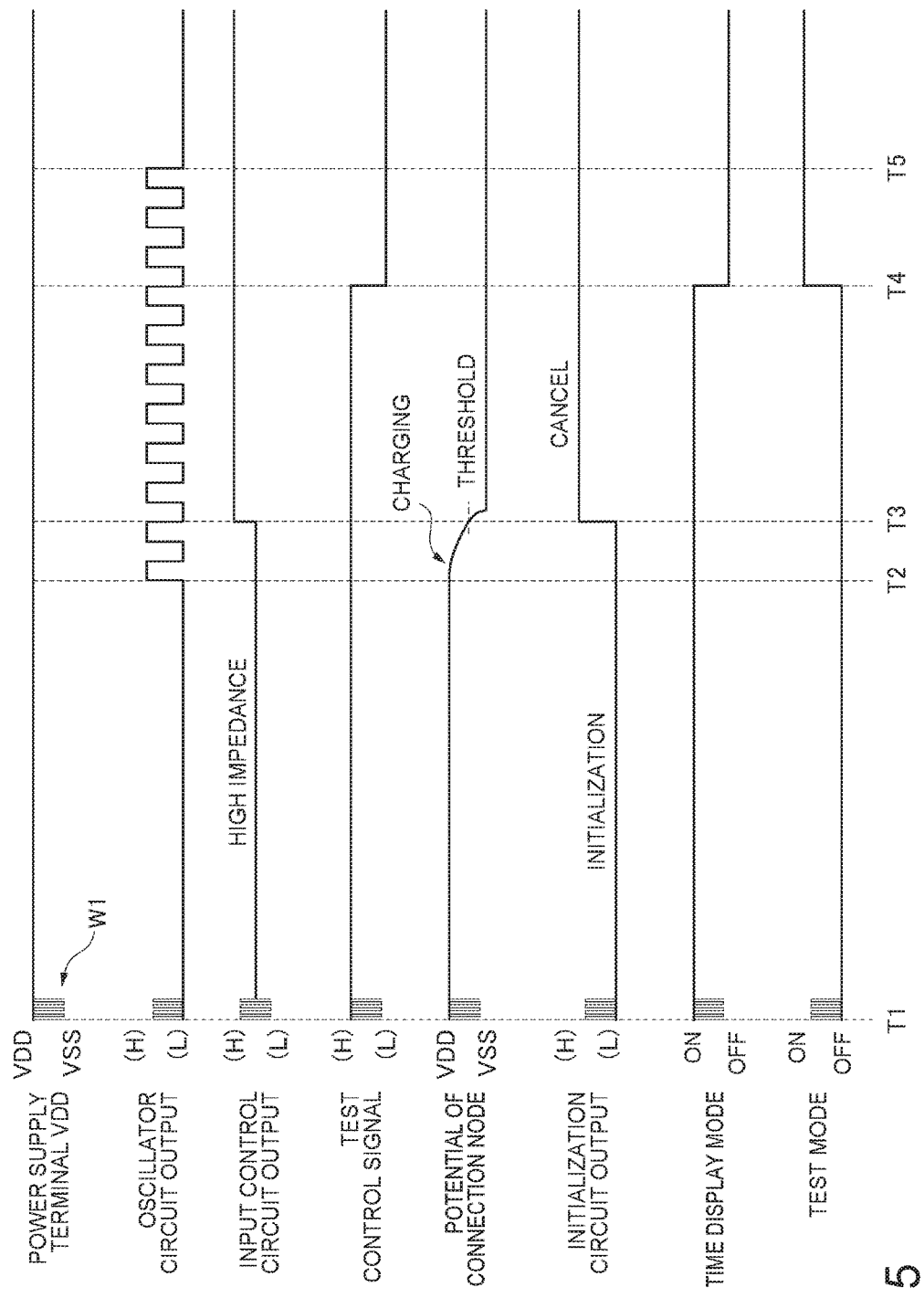
FIG. 5 is a timing chart of the operation of the IC device according to an embodiment of the invention.

As shown in FIG. 5, because a charge is not stored in capacitors C1 and C2 of the initialization circuit 30 when a battery is installed in the electronic timepiece 1 at time T1, the potential of node A1 is VDD, and a Low level initialization control signal is output from the NOT gate 31.

Immediately after time T1, the oscillator circuit 11 does not output the clock signal. The test control circuit 15 outputs a test control signal setting the non-test mode (normal mode) by outputting a High level signal.

Because a Low level initialization control signal is output, the output terminal 41 of the input control circuit 40 is isolated from the power supply terminals VDD, VSS, and goes to a high impedance state. As a result, because of the constant-current source, that is, the initialization state holding circuit 16, the potential of the first input terminals 231, 241 of the logic circuits 23, 24 in the initialization control circuit 20A decreases to VSS, and goes to a Low level. That is, a Low level initialization state hold signal is output from the initialization state holding circuit 16 to the initialization control circuit 20A.

As a result, the capacitors C1 and C2 are not charged, and the potential of node A1 is held at VDD. The NOT gate 31 therefore continues to output a Low level initialization control signal. The frequency divider 12, pulse shaping filter 13, and driver 14 therefore execute the initialization process, and circuits 12 to 14 are set to the time display mode.

When a battery is installed, chattering may occur at the power supply terminal VDD as indicated by waveform W1. When this happens, the signal level of the test control signal may repeatedly change between the High level and Low level. However, the test control signal is not input to the initialization control circuit 20A by the input control circuit 40, and the initialization state hold signal is output from the initialization state holding circuit 16 to the initialization control circuit 20A in this embodiment of the invention, the capacitors C1 and C2 are not charged as described above, and the initialization circuit 30 can continue to output a Low level initialization control signal.

When the oscillator circuit 11 then starts operating and outputs the clock signal at time T2 while the test control circuit 15 outputs a test control signal setting the non-test mode, capacitors C1 and C2 are alternately charged, and the potential of node A1 decreases toward VSS.

Then at time T3, the potential of node A1 goes to or below the threshold of the NOT gate 31, and a High level initialization control signal is output from the NOT gate 31. As a result, the initialization process of the frequency divider 12, pulse shaping filter 13, and driver 14 is cancelled. Note that the circuits 12 to 14 remain in the time display mode.

When a High level initialization control signal is output, the output terminal 41 of the input control circuit 40 is connected to power supply terminals VDD, VSS, and a signal of the inverted phase of the test control signal is output from the output terminal 41. Because the test control signal is a High level signal at this time, a Low level signal is output from the output terminal 41. As a result, the potential of node A1 of the initialization circuit 30 is held at VSS by the initialization control circuit 20A, and the NOT gate 31 continues outputting a High level initialization control signal.

When at time T4 the crown is pulled out to the first stop in the operation to start the test mode, and the test signal is input to the test terminal TEST, the test control circuit 15 outputs the test control signal setting the test mode by outputting a Low level signal. As a result, the frequency divider 12 and pulse shaping filter 13 are set to the test mode. In the test mode, the waveform of the motor drive pulse is tested, and the consumption current is tested.

As a result, a High level signal is output from the input control circuit 40. The potential of node A1 therefore goes to the VSS by the initialization control circuit 20A, and the NOT gate 31 continues outputting a High level initialization control signal.

Because the frequency divider 12, pulse shaping filter 13, and driver 14 test runs at time T5, the clock signal output process of the oscillator circuit 11 is stopped by control of the test control circuit 15. Because the potential of node A1 remains at VSS in this case, the NOT gate 31 continues outputting a High level initialization control signal.

Effect of the Invention

In this embodiment of the invention the initialization circuit 30 does not output a Low level initialization control signal after a battery is installed until the oscillator circuit 11 operates the clock signal is output. The initialization process of internal circuits can therefore execute and the internal circuits can be set to the time display mode even if chattering occurs when a battery is installed and the signal level of the test control signal changes repeatedly.

As a result, the reliability of an electronic timepiece 1 in which the displayed time is controlled by internal circuits can be improved.

Furthermore, because the internal circuits do not operate improperly due to not being initialized, current consumption increasing and the battery life shortening due to incorrect circuit operation can be suppressed.

Furthermore, because the capacitor C2 is not charged before the battery is installed, the initialization circuit 30 can reliably output a Low level initialization control signal when a battery is installed.

In addition, the initialization circuit 30 can be embodied by a simple circuit using capacitors C1 and C2.

This embodiment of the invention can also reduce current consumption in the test mode as the capacity of the constant-current source used as the initialization state holding circuit 16 decreases.

Other Embodiments

The invention is not limited to the embodiments described above, and can be modified and improved in many ways without departing from the scope of the accompanying claims.

Figure 6:
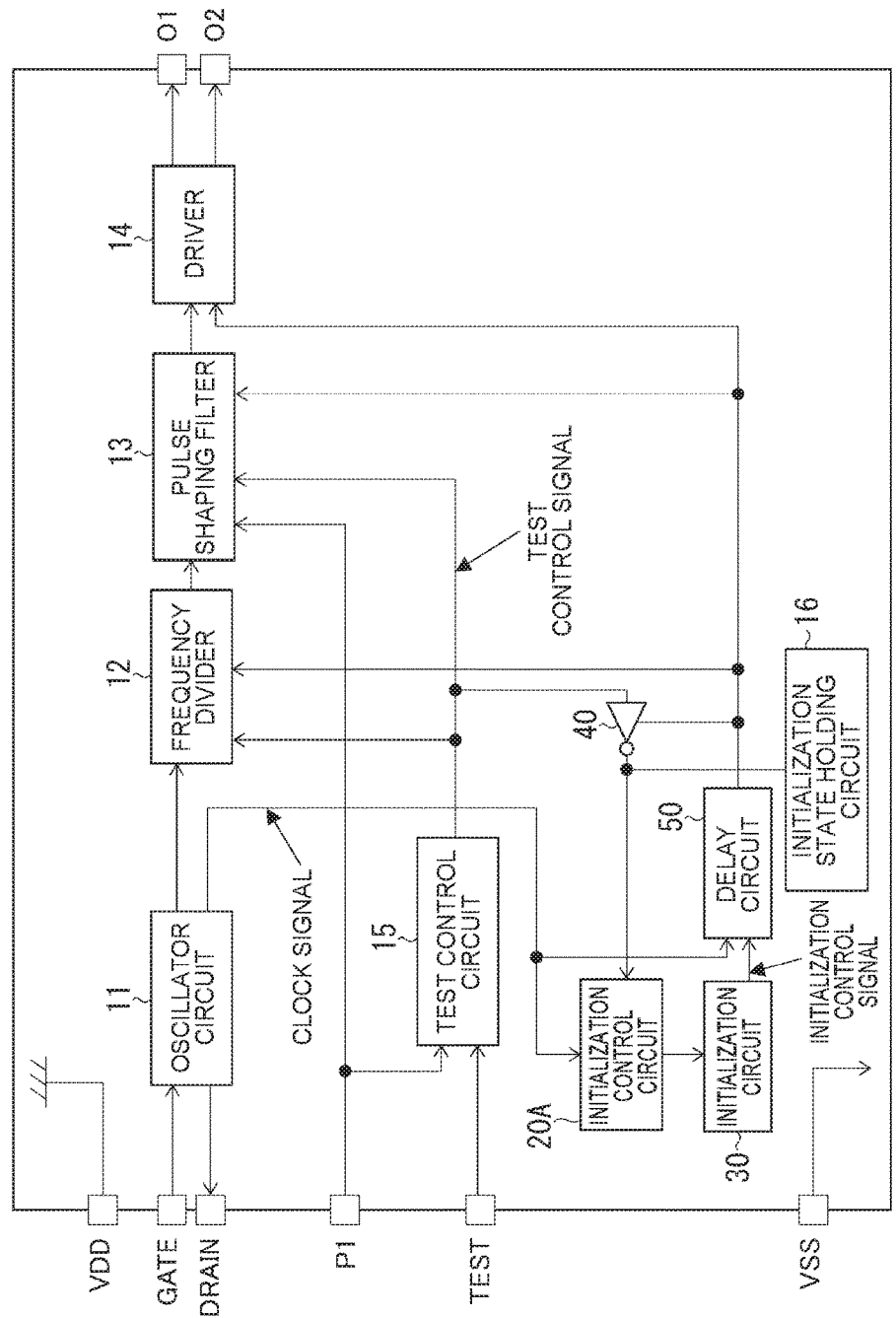
FIG. 6 is a circuit diagram of an IC device according to another embodiment of the invention.

Because the length of the initialization process increases in the embodiment described above, a delay circuit 50 that delays the initialization control signal may be disposed after the initialization circuit 30 as shown in FIG. 6.

Figure 7:
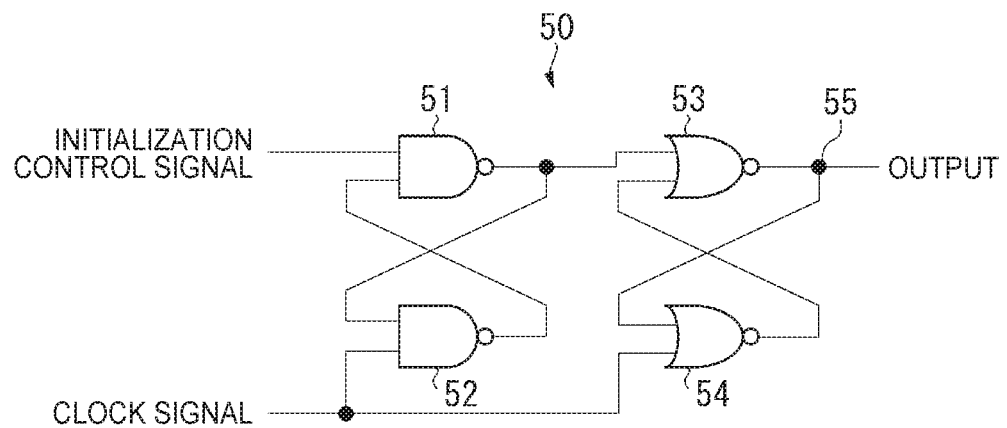
FIG. 7 is a circuit diagram of a delay circuit according to another embodiment of the invention.

A circuit having S-R latches connected in multiple stages can be used for the delay circuit 50. As shown in FIG. 7, the delay circuit 50 in this case comprises NAND gates 51, 52, and NOR gates 53, 54. The initialization control signal and the output signal from NAND gate 52 are input to NAND gate 51. The clock signal and output signal from NAND gate 51 are input to NAND gate 52. The output signal of the NAND gate 51 and output signal from NOR gate 54 are input to NOR gate 53, and the output signal is output from the output terminal 55. The clock signal and the output signal from the NOR gate 53 are input to NOR gate 54.

When a Low level initialization control signal is input, this delay circuit 50 always outputs a Low level signal. When a High level initialization control signal is input and the clock signal is not input, the delay circuit 50 continues outputting a Low level initialization control signal. When the clock signal is then input, the delay circuit 50 outputs a High level signal. As a result, the High level initialization control signal can be delayed for one period of the clock signal.

Figure 8:
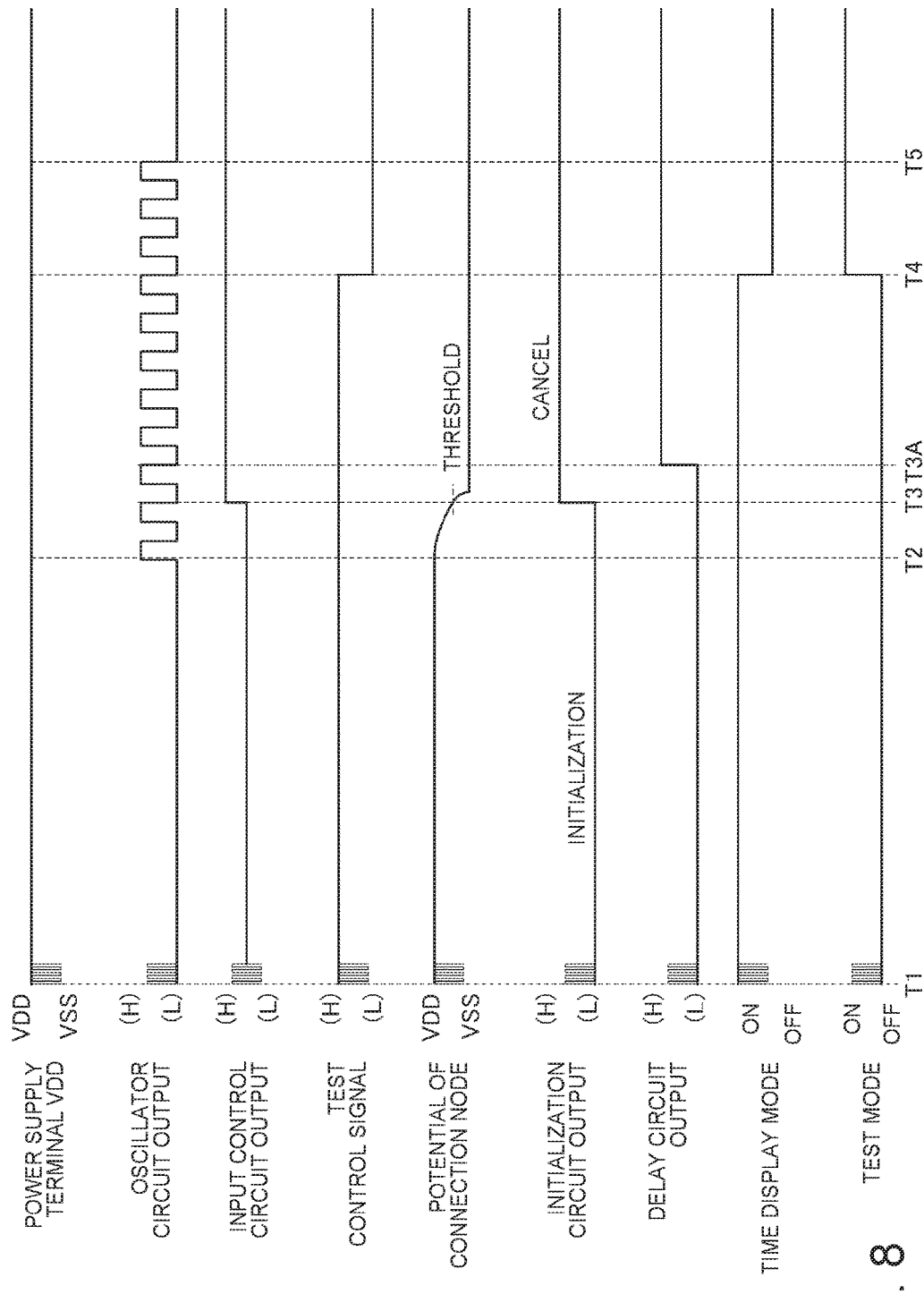
FIG. 8 is a timing chart of the operation of the IC device according to another embodiment of the invention.

By using this delay circuit 50, as shown in FIG. 8, a Low level signal is output from the delay circuit 50 at time T3 when the initialization circuit 30 outputs a High level initialization control signal. At time T3A when the clock signal changes from High to Low level, a High level signal is output from the delay circuit 50. The time delay of the delay circuit 50 can be changed according to the number of S-R latches.

Because this configuration can increase the duration of the initialization process, the internal circuits can be reliably initialized even when chattering lasts for a long time. Furthermore, because there is no need to change the configuration of the initialization circuit 30 and initialization control circuit 20A, the duration of the initialization process can be increased by a small scale design change.

An operation input control circuit 17 that does not input an operating signal to the test control circuit 15 if the crown 8 is operated when a Low level initialization control signal is output to the IC device 10A, but inputs the operating signal to the test control circuit 15 if the crown 8 is operated when a High level initialization control signal is output to the IC device 10A, may be disposed to the embodiments described above.

Figure 9:
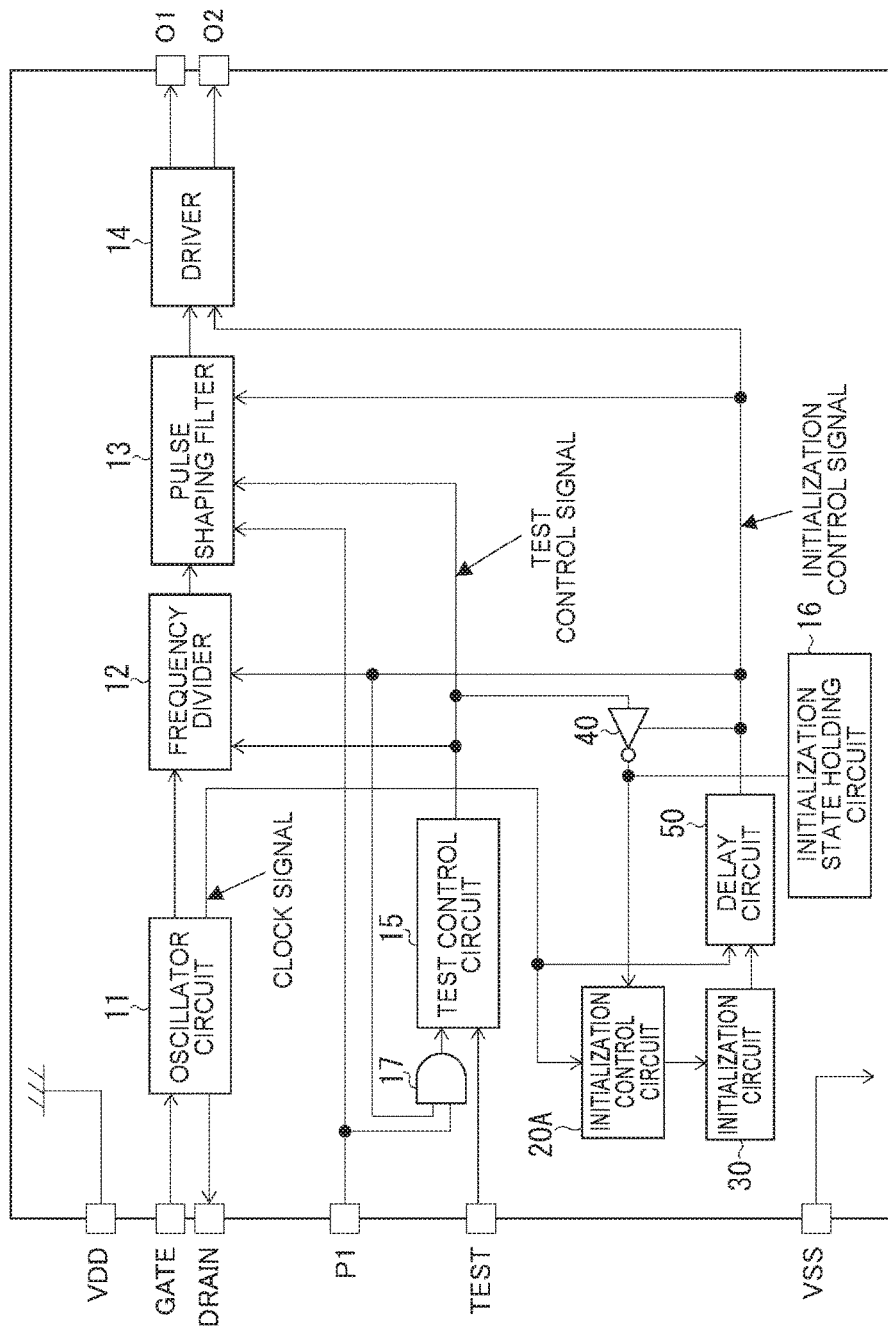
FIG. 9 is a circuit diagram of an IC device according to another embodiment of the invention.
Figure 10:
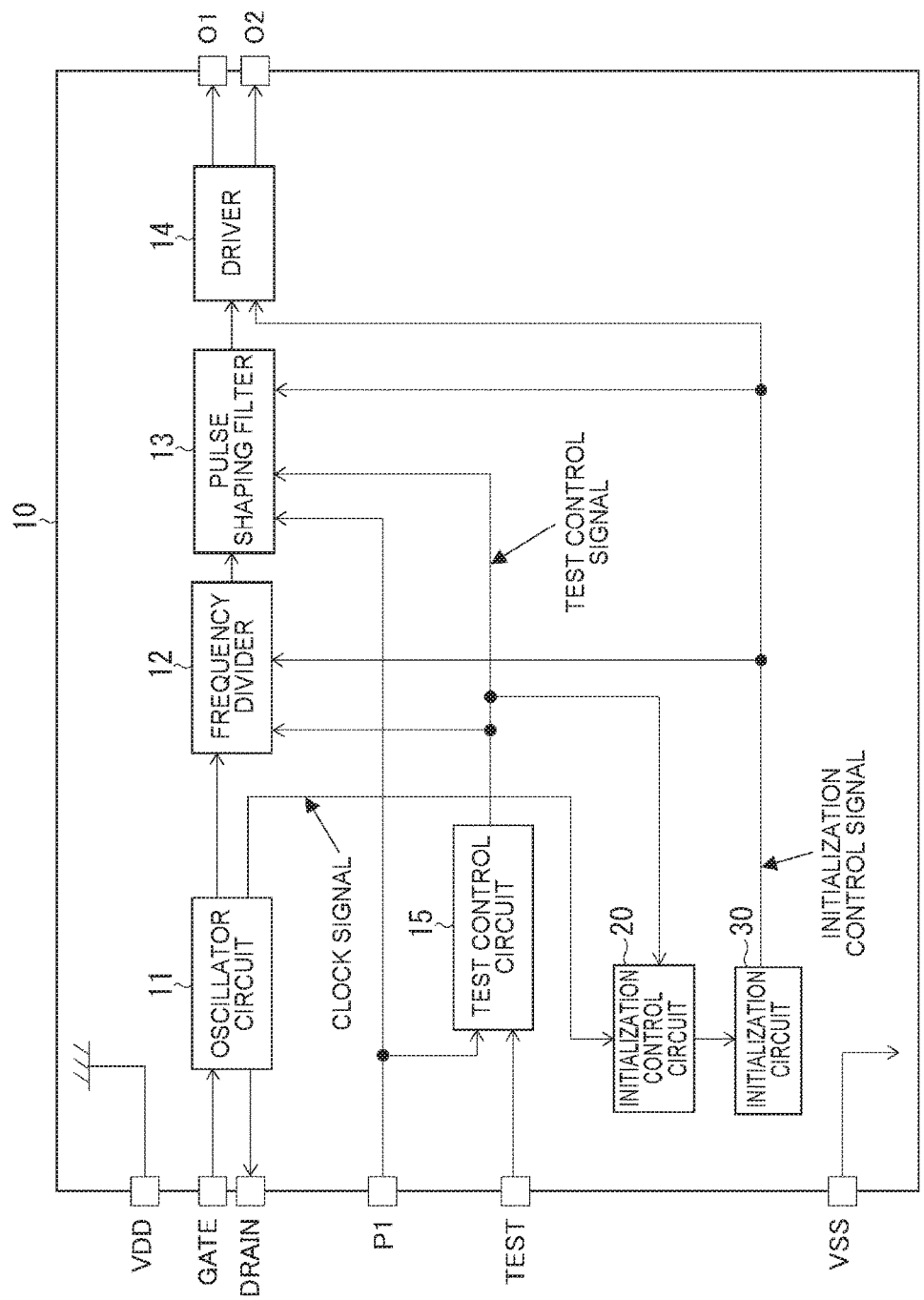
FIG. 10 is a circuit diagram of an IC device according to the related art.
Figure 11:
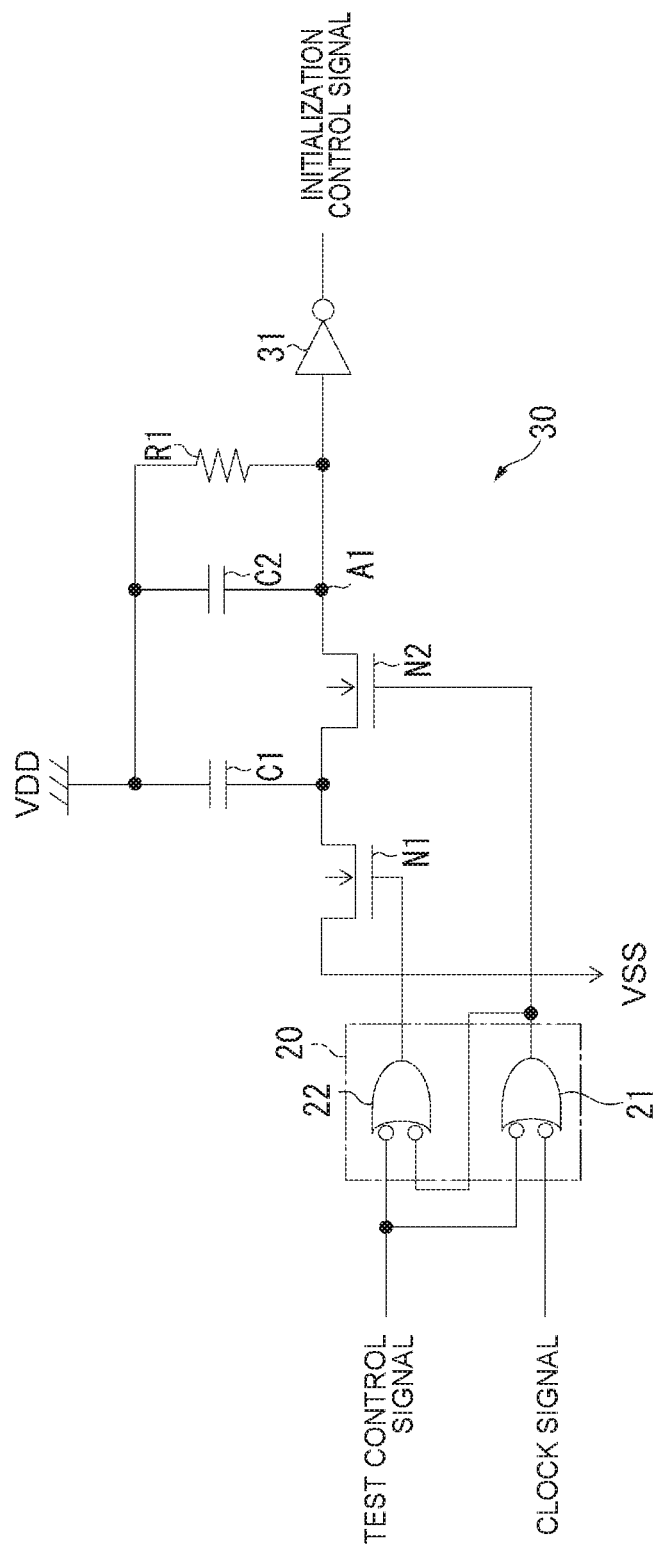
FIG. 11 is a circuit diagram of an initialization control circuit and initialization circuit according to the related art.
Figure 12:
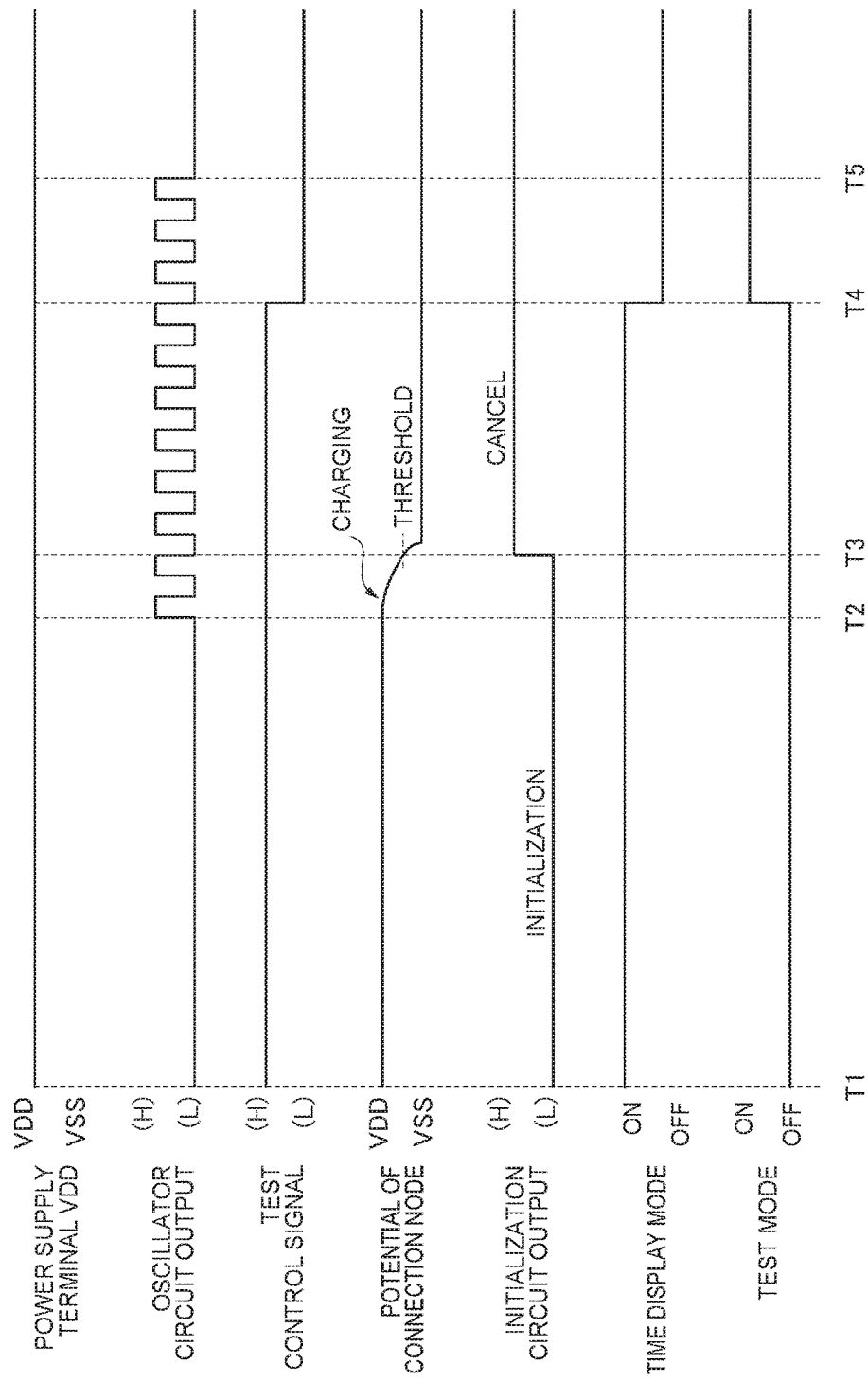
FIG. 12 is a timing chart of the operation of the IC device according to the related art.
Figure 13:
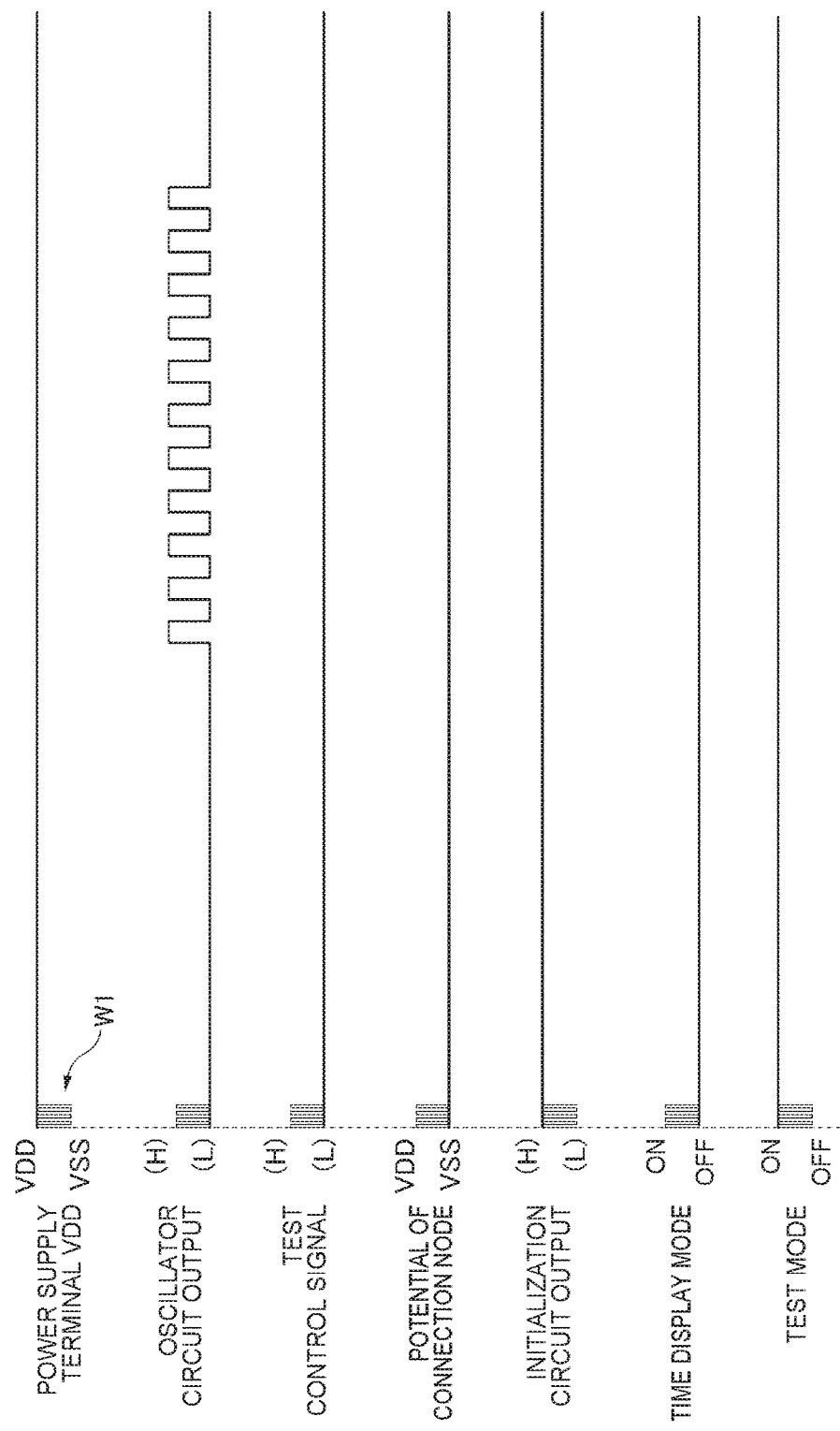
FIG. 13 illustrates operation when chattering occurs in an IC device according to the related art.

FIG. 9 shows an example of this embodiment having an operation input control circuit 17. As shown in FIG. 9, the operation input control circuit 17 is embodied by an AND gate, has one input terminal connected to the operation input terminal P1, and the initialization control signal is input to the other input terminal.

Thus comprised, when the internal circuits are initialized, an operating signal is not input to the test control circuit 15. More specifically, the operating signal can be masked so that the operating signal is not input to the test control circuit 15. As a result, setting the test mode while the frequency divider 12 and pulse shaping filter 13 are executing the initialization process can be avoided when the crown 8 is not intentionally operated to set the test mode (by pulling the crown 8 out to the first stop, for example). As a result, the initialization process of the circuits 12 to 14 can be appropriately executed.

Furthermore, because the operating signal is input to the test control circuit 15 when the initialization process is not executing, the test control signal setting the test mode can be output from the test control circuit 15 by operating the crown 8 to set the test mode, and the frequency divider 12 and pulse shaping filter 13 can be set to the test mode.

This embodiment may also be configured to not input the operating signal of the button 9 to the test control circuit 15 or mode setting circuit that sets the stopwatch mode, alarm mode, or other mode while the internal circuits are being initialized. In other words, a mask circuit that does not input the operating signal from the button 9 to the mode setting circuits while the Low level initialization control signal is being output, and inputs the operating signal from the button 9 to the mode setting circuits while a High level initialization control signal is being output, may also be disposed to the IC device.

Thus comprised, setting the internal circuits to an operating mode while the initialization process is executing can be avoided if the button 9 is unintentionally operated to set a particular mode while the internal circuits are being initialized. As a result, the internal circuit initialization process can be appropriately executed.

The input control circuit 40 is embodied by a clocked inverter in the foregoing embodiments, but the invention is not so limited. For example, the input control circuit 40 may be configured with an n-channel field effect transistor. In this configuration, the transistor is connected between the test control circuit 15 and initialization control circuit 20A, the initialization control signal is input to the gate electrode, and a NOT gate is disposed after the transistor.

The input control circuit 40 may also be configured with a p-channel field effect transistor. In this configuration, the transistor is connected between the test control circuit 15 and initialization control circuit 20A, the initialization control signal is input inverted to the gate electrode, and a NOT gate is disposed after the transistor.

The initialization state holding circuit 16 is embodied by a constant-current source in the foregoing embodiments, but the invention is not so limited. For example, the initialization state holding circuit 16 may be configured by pull-up resistors or pull-down resistors. However, a constant-current source is preferable because deviation in the signal level of the initialization state hold signal due to variation in resistance is low.

In the foregoing embodiments the initialization circuit 30 outputs a Low level signal as the first level signal for initializing the internal circuits, and outputs a High level signal as the second level signal to cancel initialization, but the invention is not so limited. More specifically, a High level signal may be output as the first level signal, and a Low level signal output as the second level signal.

A circuit having capacitors C1 and C2 is used as the initialization circuit 30 in the foregoing embodiments, but the invention is not so limited. More specifically, the initialization circuit 30 may be any circuit design that outputs an initialization control signal of a first level when a battery is installed, and outputs an initialization control signal of a second level when a clock signal is input.

The function control circuit in the foregoing embodiments is a test control circuit 15 that controls the test mode, but the invention is not so limited. More specifically, the function control circuit may be any circuit design that controls a stopwatch function, alarm function or other function than the test mode.

The display device of the electronic timepiece 1 in the foregoing embodiments is embodied by hands 5 to 7 and a dial 3, but the invention is not so limited. For example, the display device may be embodied by an LCD panel or other digital display device.

The invention is also not limited to use in electronic timepieces, and may be broadly applied to wrist-word devices, cell phones, and other electronic devices that display time.

The invention being thus described, it will be obvious that it may be varied in many ways. Such variations are not to be regarded as a departure from the spirit and scope of the invention, and all such modifications as would be obvious to one skilled in the art are intended to be included within the scope of the following claims.

The entire disclosure of Japanese Patent Application No. 2017-058223, filed Mar. 23, 2017 is expressly incorporated by reference herein.

What is claimed is:

1. An electronic circuit comprising:
   an oscillator circuit configured to output a clock signal;
   a function control circuit configured to output a function control signal that sets a function mode and a non-function mode;
   an internal circuit;
   an initialization circuit configured to output an initialization control signal that changes between a first level executing an internal circuit initialization process, and a second level cancelling the initialization process;
   an initialization control circuit configured to control the initialization circuit;
   an input control circuit configured to change input and non-input of the function control signal to the initialization control circuit; and
   an initialization state holding circuit;
   the initialization circuit outputting the initialization control signal at the first level when a battery is installed;
   the input control circuit not inputting the function control signal to the initialization control circuit when the initialization control signal is output at the first level, and inputting the function control signal to the initialization control circuit when the initialization control signal is output at the second level;
   the initialization state holding circuit outputting an initialization state hold signal to the initialization control circuit when the function control signal is not input to the initialization control circuit; and
   the initialization control circuit, when the initialization state hold signal is input, continuing to output the initialization control signal at the first level to the initialization circuit until the clock signal is output, and when the initialization state hold signal was input and the clock signal then output, outputting the initialization control signal at the second level to the initialization circuit.

2. The electronic circuit described in claim 1, wherein:
   the initialization circuit has a capacitor, outputs the initialization control signal at the first level when the voltage charge of the capacitor is less than a previously set threshold, and outputs the initialization control signal at the second level when the voltage charge is greater than or equal to the threshold; and
   the initialization control circuit charges the capacitor according to the clock signal when the initialization state hold signal is input.

3. The electronic circuit described in claim 1, further comprising:
   a delay circuit configured to delay the initialization control circuit output from the initialization circuit to the internal circuit.

4. The electronic circuit described in claim 1, further comprising:
   an operation input terminal to which an operating signal corresponding to operation of an operating member is input; and
   an operation input control circuit configured to switch input and non-input of the operating signal to the function control circuit;
   the function control circuit outputting the function control signal that sets the function mode in response to the operating signal;
   the function control signal is input to the internal circuit; and
   the operation input control circuit does not input the operating signal to the function control circuit while the initialization control signal is output at the first level.

5. An electronic timepiece comprising:
   the electronic circuit described in claim 1; and
   a display device configured to display time as controlled by the internal circuit.

6. An electronic timepiece comprising:
   the electronic circuit described in claim 2; and
   a display device configured to display time as controlled by the internal circuit.

7. An electronic timepiece comprising:
   the electronic circuit described in claim 3; and
   a display device configured to display time as controlled by the internal circuit.

8. An electronic timepiece comprising:
   the electronic circuit described in claim 4; and
   a display device configured to display time as controlled by the internal circuit.

* * * * *